(12) United States Patent
Motonobu

(10) Patent No.: US 9,299,828 B2
(45) Date of Patent: Mar. 29, 2016

(54) NITRIDE-BASED TRANSISTORS HAVING STRUCTURES FOR SUPPRESSING LEAKAGE CURRENT

(71) Applicant: SEOUL SEMICONDUCTOR CO., LTD., Ansan-si (KR)

(72) Inventor: Takeya Motonobu, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 0 days.

(21) Appl. No.: 14/558,225

(22) Filed: Dec. 2, 2014

(65) Prior Publication Data

US 2015/0162428 A1 Jun. 11, 2015

(30) Foreign Application Priority Data

Dec. 5, 2013 (KR) .................. 10-2013-0150320

(51) Int. Cl.
| | |
|---|---|
| H01L 29/78 | (2006.01) |
| H01L 29/20 | (2006.01) |
| H01L 29/06 | (2006.01) |
| H01L 29/40 | (2006.01) |
| H01L 23/31 | (2006.01) |

(52) U.S. Cl.
CPC ........ H01L 29/7811 (2013.01); H01L 29/0607 (2013.01); H01L 29/0619 (2013.01); H01L 29/0653 (2013.01); H01L 29/2003 (2013.01); H01L 29/407 (2013.01); H01L 29/7802 (2013.01); H01L 29/7813 (2013.01); *H01L 23/31* (2013.01); *H01L 2924/0002* (2013.01)

(58) Field of Classification Search
CPC ............ H01L 29/7811; H01L 29/0607; H01L 29/0653; H01L 29/407; H01L 29/0619; H01L 29/7813; H01L 29/7802
See application file for complete search history.

(56) References Cited

U.S. PATENT DOCUMENTS

| | | | | |
|---|---|---|---|---|
| 7,491,983 | B2* | 2/2009 | Otsuka | H01L 29/7787 257/183 |
| RE41,509 | E * | 8/2010 | Kinzer | H01L 29/0634 257/331 |
| 8,143,650 | B2* | 3/2012 | Sato | H01L 21/8252 257/183 |
| 2006/0138457 | A1* | 6/2006 | Otsuka | H01L 29/7787 257/194 |
| 2009/0166678 | A1* | 7/2009 | Sato | H01L 21/8252 257/194 |
| 2012/0319127 | A1 | 12/2012 | Chowdhury et al. | |
| 2014/0042446 | A1* | 2/2014 | Chiang | H01L 29/66462 257/76 |
| 2014/0264449 | A1* | 9/2014 | Parsey, Jr. | H01L 21/7624 257/194 |
| 2015/0060943 | A1* | 3/2015 | Motonobu | H01L 29/66666 257/192 |

* cited by examiner

*Primary Examiner* — Allan R Wilson
(74) *Attorney, Agent, or Firm* — H.C. Park & Associates, PLC

(57) ABSTRACT

A nitride-based transistor includes a semiconductor structure, a gate electrode and a leakage current suppression structure. The semiconductor structure includes a first nitride-based semiconductor layer doped with impurities of a first conductivity type, a second nitride-based semiconductor layer doped with impurities of a second conductivity type, and a third nitride-based semiconductor layer doped with impurities of the first conductivity type. The gate electrode overlaps the second nitride-based semiconductor layer. The leakage current suppression structure is disposed along edges of the semiconductor structure. The leakage current suppression structure includes a depletion layer in at least one of the first and third nitride-based semiconductor layers.

20 Claims, 19 Drawing Sheets

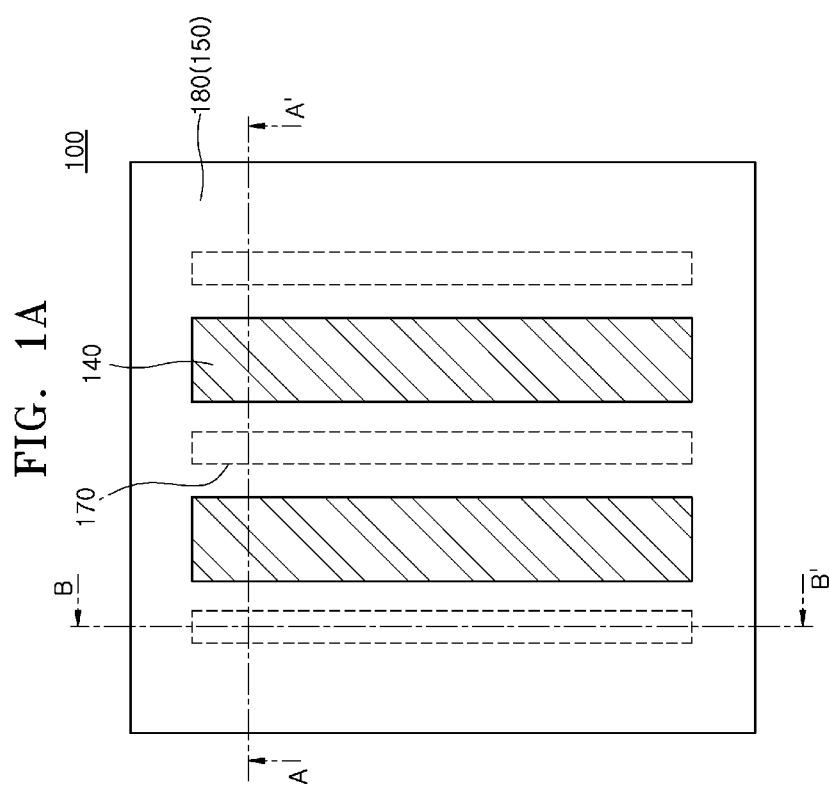

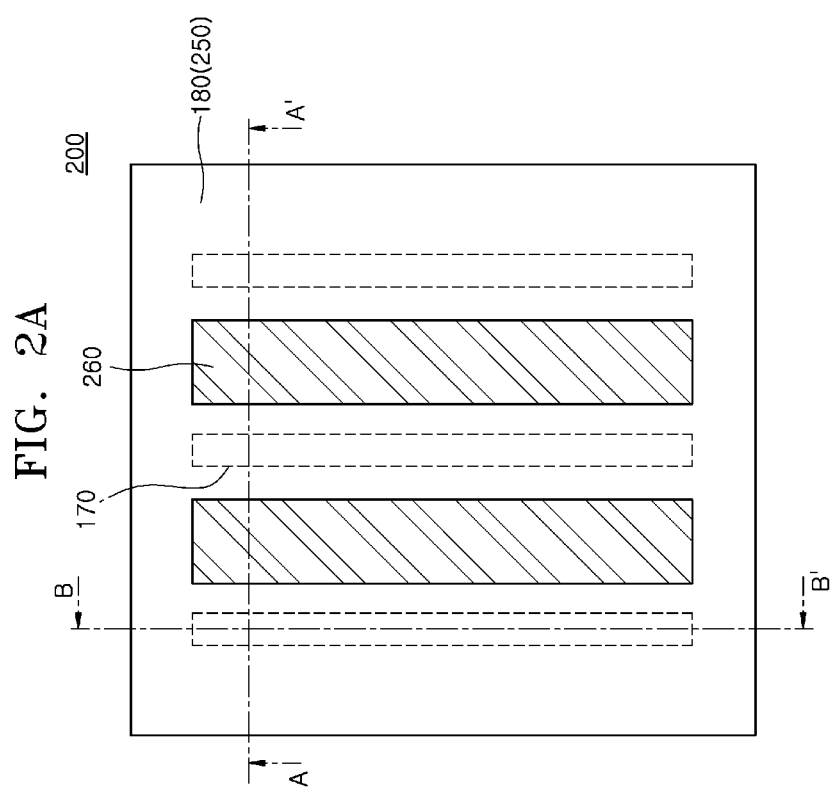

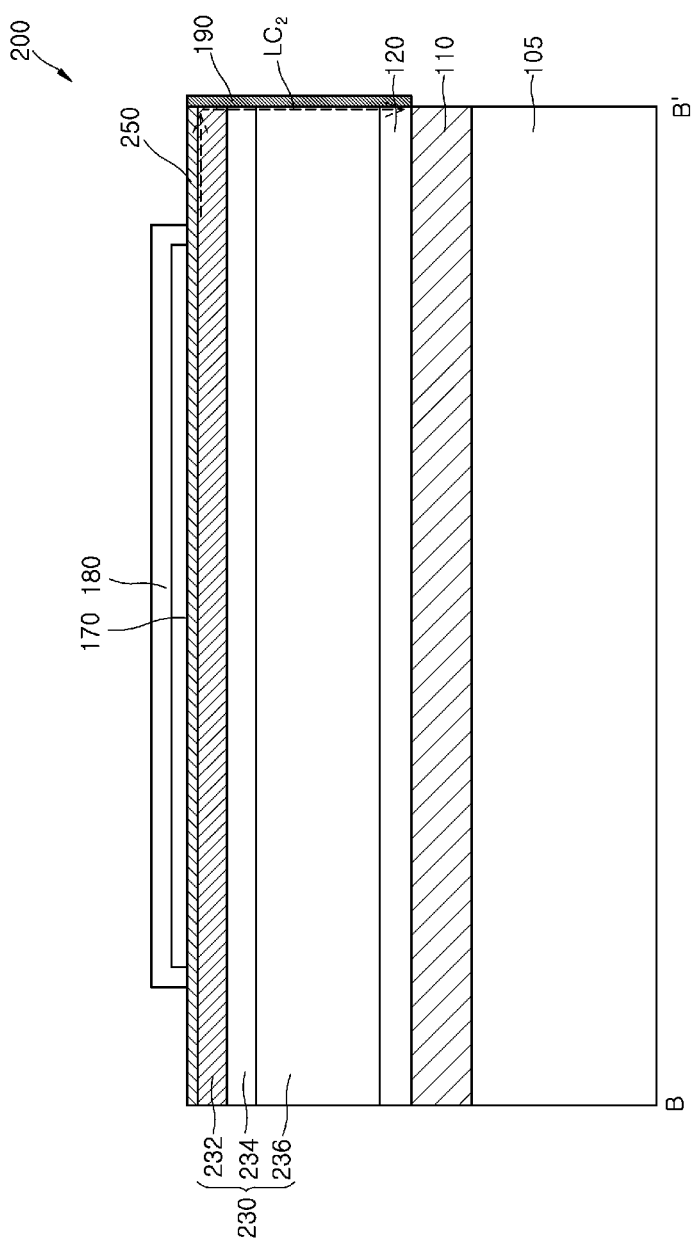

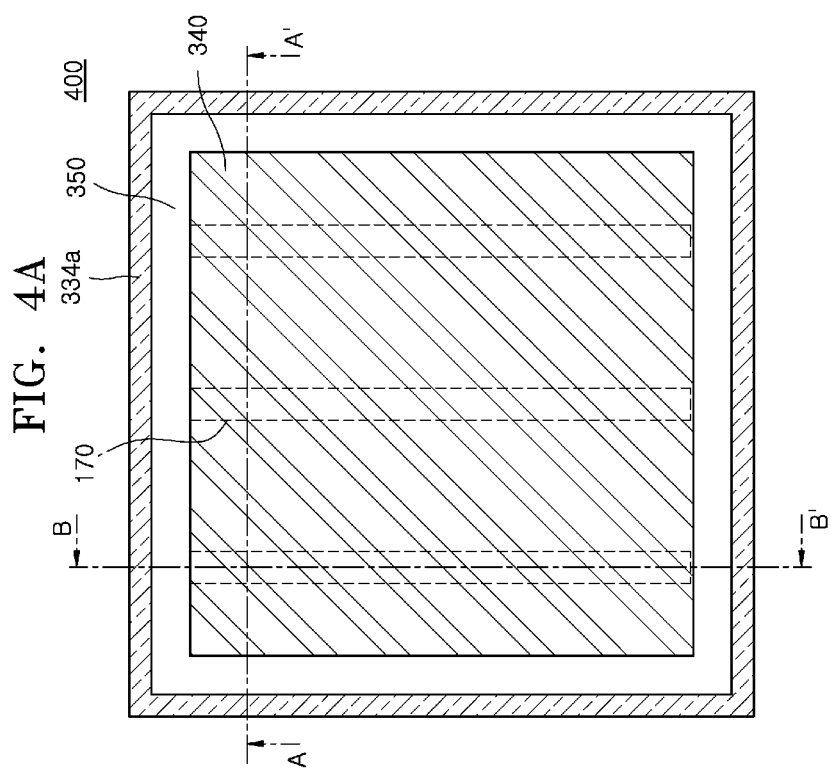

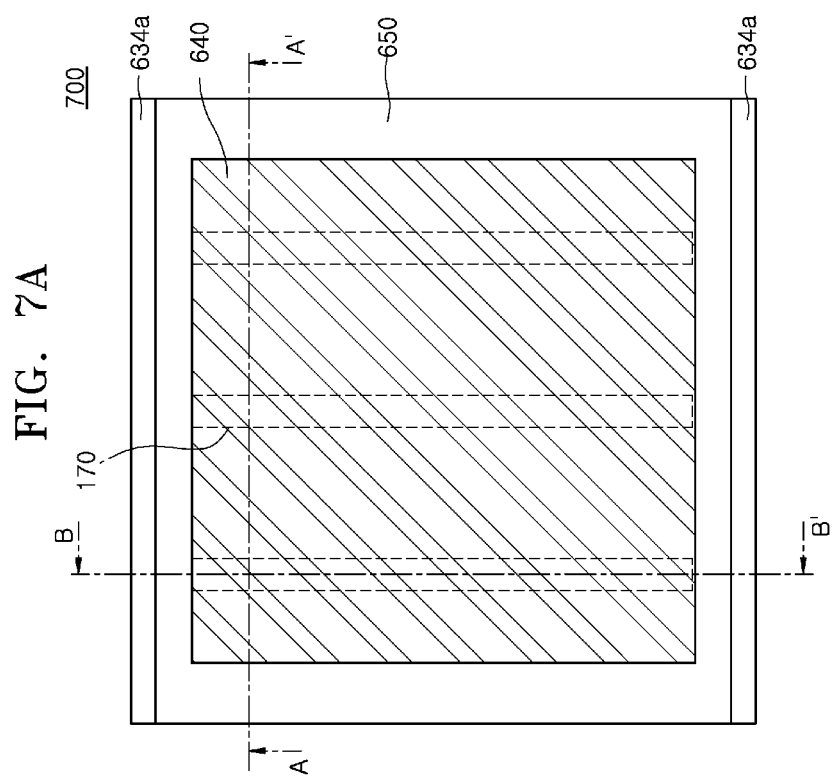

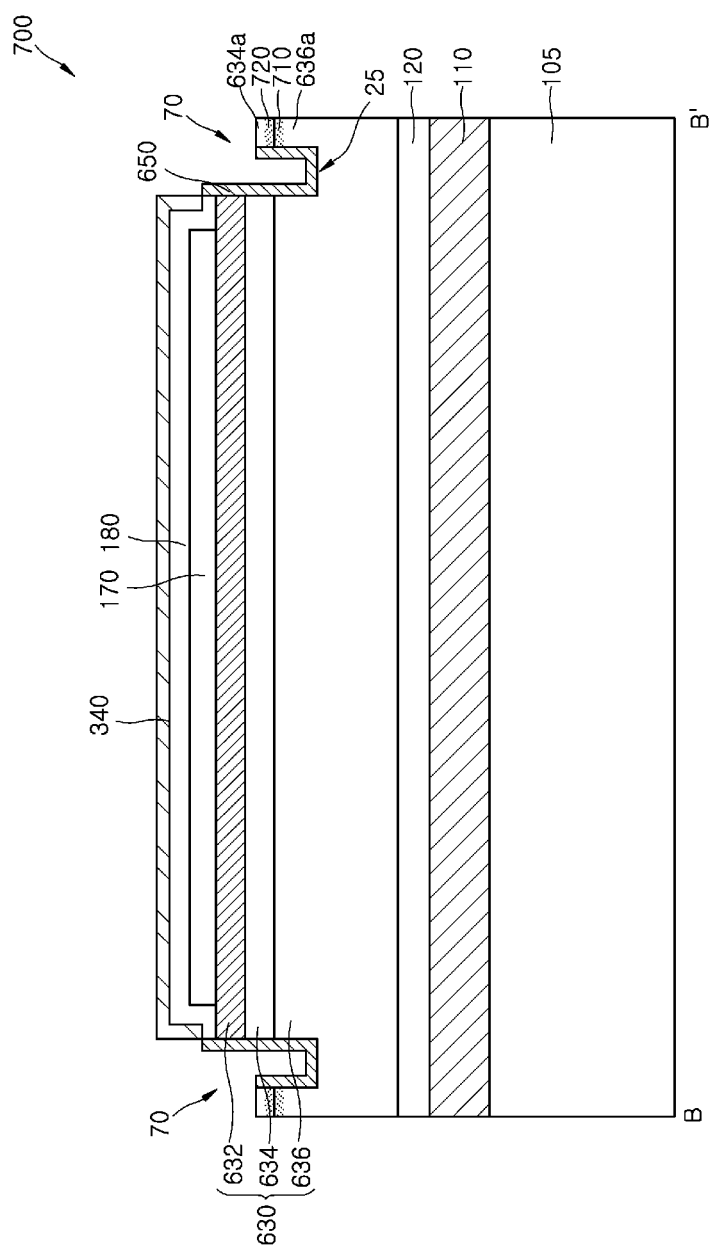

NITRIDE-BASED TRANSISTORS HAVING STRUCTURES FOR SUPPRESSING LEAKAGE CURRENT

CROSS-REFERENCE TO RELATED APPLICATION

The present application claims priority from and the benefit of Korean Patent Application No. 10-2013-0150320, filed on Dec. 5, 2013, which is incorporated herein by reference for all purposes as if fully set forth herein.

BACKGROUND

1. Field

Exemplary embodiments of the present invention relate to nitride-based transistors having structures for suppressing leakage current.

2. Discussion of the Background

In the electronics industry, high voltage transistors operating at a high speed are increasingly in demand in view of the development of information and communication technologies. In response to such a demand, Group III-V compound semiconductor transistors, for example, gallium nitride (GaN) transistors have been proposed. GaN transistors may exhibit a relatively fast switching characteristic and a relatively high breakdown voltage characteristic as compared with the conventional silicon transistors. Thus, GaN transistors may be attractive as candidates for improving the performance of communication systems.

In general, GaN transistors may be fabricated to have a planar-type configuration or a vertical-type configuration. Each of the planar-type GaN transistors may include a source region, a channel region, and a drain region that are coplanar with each other. Thus, carriers may drift in a horizontal direction along a surface of the channel region. In such a case, there may be a limitation in improving the carrier mobility. This is because an electric field at a channel surface may disturb movement of the carriers. Further, when the planar-type GaN transistors operate, an electric field may be concentrated at corners of gate electrodes of the planar-type GaN transistors. This may lead to degradation of the breakdown voltage characteristic of the planar-type GaN transistors.

Vertical GaN transistors have been proposed to solve the above disadvantages. For example, current aperture vertical electron transistors (CAVETs) are taught in U.S. Patent Publication No. 2012/0319127 A1 to Chowdhury et al. According to Chowdhury, a source electrode and a drain electrode are disposed to vertically face each other, and a P-type gallium nitride (P-GaN) layer acting as a current blocking layer is disposed between the source and drain electrodes. Accordingly, a channel current may flow in a vertical direction from the drain electrode toward the source electrode through an aperture provided by the P-type gallium nitride (P-GaN) layer.

Meanwhile, defect sites may be formed at an interface between a nitride-based semiconductor layer acting as a body layer of the GaN transistors and a passivation layer or air corresponding to a heterogeneous material of the nitride-based semiconductor layer. The passivation layer may be an insulation layer such as a silicon oxide layer. The defect sites may trap or release electric charges to cause leakage current. This leakage current may degrade a high voltage characteristic of the GaN transistors. An annealing process performed at a temperature over 600 degrees Celsius has been used to reduce a density of the defect sites. However, in spite of the annealing process, there may be limitations in reducing the leakage current.

SUMMARY

Exemplary embodiments of the present invention provide nitride-based transistors having structures for suppressing leakage current.

Additional features of the inventive concept will be set forth in the description which follows, and in part will be apparent from the description, or may be learned by practice of the inventive concept.

An exemplary embodiment of the present invention discloses a nitride-based transistor including a semiconductor structure, a gate electrode and a leakage current suppression structure. The semiconductor structure includes a first nitride-based semiconductor layer doped with impurities of a first conductivity type, a second nitride-based semiconductor layer doped with impurities of a second conductivity type, and a third nitride-based semiconductor layer doped with impurities of the first conductivity type. The gate electrode overlaps the second nitride-based semiconductor layer. The leakage current suppression structure is disposed along edges of the semiconductor structure. The first, second and third nitride-based semiconductor layers are disposed to be adjacent to each other. The leakage current suppression structure includes a depletion layer in at least one of the first and third nitride-based semiconductor layers.

An exemplary embodiment of the present invention also discloses a nitride-based transistor including a semiconductor structure, a trench disposed in edges of the semiconductor structure, and a leakage current suppression structure disposed in the trench. The semiconductor structure includes a first nitride-based semiconductor layer electrically connected to a source electrode and doped with impurities of a first conductivity type, a second nitride-based semiconductor layer contacting the first nitride-based semiconductor layer and doped with impurities of a second conductivity type, and a third nitride-based semiconductor layer electrically connected to a drain electrode and doped with impurities of the first conductivity type. The second nitride-based semiconductor layer is configured to generate a channel layer therein according to a gate voltage applied to a gate electrode. The leakage current suppression structure includes a depletion layer disposed in the third nitride-based semiconductor layer.

An exemplary embodiment of the present invention also discloses a nitride-based transistor including a semiconductor structure, a trench disposed in edges of the semiconductor structure, and a leakage current suppression structure disposed to be adjacent to an outer sidewall of the trench. The semiconductor structure includes a first nitride-based semiconductor layer electrically connected to a source electrode and doped with impurities of a first conductivity type, a second nitride-based semiconductor layer contacting the first nitride-based semiconductor layer and doped with impurities of a second conductivity type and a third nitride-based semiconductor layer electrically connected to a drain electrode and doped with impurities of the first conductivity type. The second nitride-based semiconductor layer is configured to generate a channel layer therein according to a gate voltage applied to a gate electrode. The leakage current suppression structure includes a stack pattern that has a second nitride-based semiconductor pattern corresponding to a portion of the second nitride-based semiconductor layer and a third nitride-based semiconductor pattern corresponding to a portion of the third nitride-based semiconductor layer.

It is to be understood that both the foregoing general description and the following detailed description are exemplary and explanatory and are intended to provide further explanation of the inventive concept as claimed.

BRIEF DESCRIPTION OF THE DRAWINGS

The accompanying drawings, which are included to provide a further understanding of the inventive concept and are incorporated in and constitute a part of this specification, illustrate exemplary embodiments of the inventive concept, and together with the description serve to explain the principles of the present invention.

FIG. 1A is a plan view illustrating a nitride-based transistor according to an exemplary embodiment of the present invention.

FIG. 2A is a plan view illustrating a nitride-based transistor according to an exemplary embodiment of the present invention.

FIG. 2C is a cross-sectional view taken along a line B-B' of FIG. 2A.

FIG. 4A is a plan view illustrating a nitride-based transistor according to an exemplary embodiment of the present invention.

FIG. 7A is a plan view illustrating a nitride-based transistor according to an exemplary embodiment of the present invention.

FIG. 7C is a cross-sectional view taken along a line B-B' of FIG. 7A.

DETAILED DESCRIPTION OF THE ILLUSTRATED EMBODIMENTS

Figure 1B:
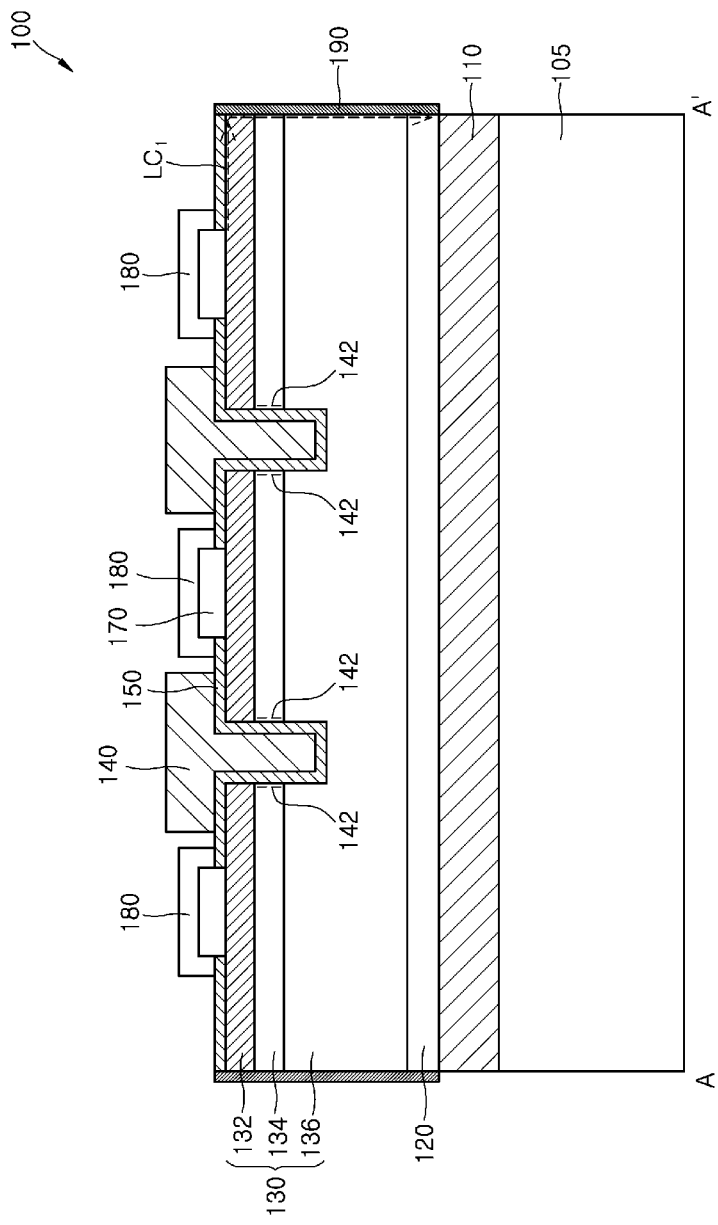
FIG. 1B is a cross-sectional view taken along a line A-A' of FIG. 1A.

Various exemplary embodiments will now be described more fully hereinafter with reference to the accompanying drawings. The following exemplary embodiments are provided to fully convey the inventive concept to those skilled in the art. Thus, these exemplary embodiments may be embodied in different forms and should not be construed as limited to the exemplary embodiments set forth herein. In the drawings, the widths, lengths and thicknesses of layers and regions are exaggerated for clarity.

In the present specification, it will be understood that when an element is referred to as being "on," "above", "below," or "under" another element, it can be directly "on," "above", "below," or "under" the other element, respectively, or intervening elements may also be present. Moreover, spatially relative terms, such as "beneath," "below," "lower," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented above the other elements or features.

In the drawings, like reference numerals refer to like elements throughout. In addition, the singular terms "a," "an" and "the" used herein are intended to include the plural forms as well, unless the context clearly indicates otherwise. It will be further understood that the terms "comprise," "comprising," "includes," "including," "have", "having" and variants thereof specify the presence of stated features, integers, steps, operations, elements, and/or components, but do not preclude the presence and/or addition of one or more other features, integers, steps, operations, elements, components, and/or groups thereof.

In the specification, it will also be understood that a channel formed in a vertical direction means a channel through which carriers are vertically drifted from a source electrode toward a drain electrode. Thus, the channel may include not only a channel region that is formed to be generally orthogonal to a reference surface such as a surface of a substrate but also a channel region that is formed to be non-orthogonal to the reference surface at a predetermined angle. When the channel region is formed by etching a gallium nitride (GaN) layer, an inclined angle of the channel region with respect to a surface of the GaN layer may be different according to an etch process applied to the GaN layer. In some cases, the inclined angle of the channel region may be within a range of about 30 degrees to about 90 degrees according to a lattice plane of the GaN layer to which the etch process is applied. In more detail, the inclined angle of the channel region may be within a range of about 60 degrees to about 70 degrees when the channel region is formed by etching a GaN layer with a dry etch process or a wet etch process.

Similarly, it will also be understood that a channel formed in a horizontal direction means a channel through which carriers are horizontally drifted from a source electrode toward a drain electrode. In such a case, the channel may include not only a channel region that is formed to be generally parallel with a reference surface such as a surface of a substrate but also a channel region that is formed to be non-parallel with the reference surface at a predetermined angle.

In the specification, the terms "source electrode" and "drain electrode" may be used to describe a direction of a current flowing through a channel region. Thus, if a polarity of a voltage applied between the source electrode and the drain electrode is changed, the source electrode could be termed the drain electrode and the drain electrode could be termed the source electrode.

In the specification, an interface region between a first layer and a second layer may be construed as including an interface between the first and second layers as well as internal regions of the first and second layers adjacent to the interface.

In the specification, a nitride-based semiconductor layer described in the exemplary embodiments may include a nitride material layer such as an $Al_xIn_yGa_{1-x-y}N$ layer (where, $0 \leq x \leq 1$ and $0 \leq y \leq 1$).

In the specification, it will also be understood that when a layer such as a nitride-based semiconductor layer is referred to as being doped with N-type impurities or P-type impurities, the layer can be doped to have a P-type impurity concentration of about $1 \times 10^{17}/cm^3$ to about $1 \times 10^{20}/cm^3$ or an N-type impurity concentration of about $1 \times 10^{16}/cm^3$ to about $1 \times 10^{19}/cm^3$. Furthermore, it will be understood that when a layer such as a nitride-based semiconductor layer is referred to as being "heavily" doped with N-type impurities or P-type impurities, the layer can be doped to have a P-type impurity concentration over about $1 \times 10^{20}/cm^3$ or an N-type impurity concentration over about $1 \times 10^{19}/cm^3$.

In the specification, it will be understood that when a layer has a first conductivity type or a second conductivity type, the layer is doped with N-type impurities or P-type impurities. That is, the first conductivity type and the second conductivity type may be an N-type and a P-type, respectively, or vice versa. Silicon (Si) atoms may be used as N-type dopants when a layer such as a nitride-based semiconductor layer is referred to as being doped with N-type impurities, and beryllium (Be) atoms, magnesium (Mg) atoms, calcium (Ca) atoms, carbon (C) atoms, iron (Fe) atoms or Manganese (Mn) atoms may be used as P-type dopants when a layer such as a nitride-based semiconductor layer is referred to as being doped with P-type impurities.

FIG. 1A is a plan view illustrating a nitride-based transistor 100 according to an exemplary embodiment of the present invention. FIG. 1B is a cross-sectional view taken along a line A-A' of FIG. 1A, and FIG. 1C is a cross-sectional view taken along a line B-B' of FIG. 1A.

Figure 1C:
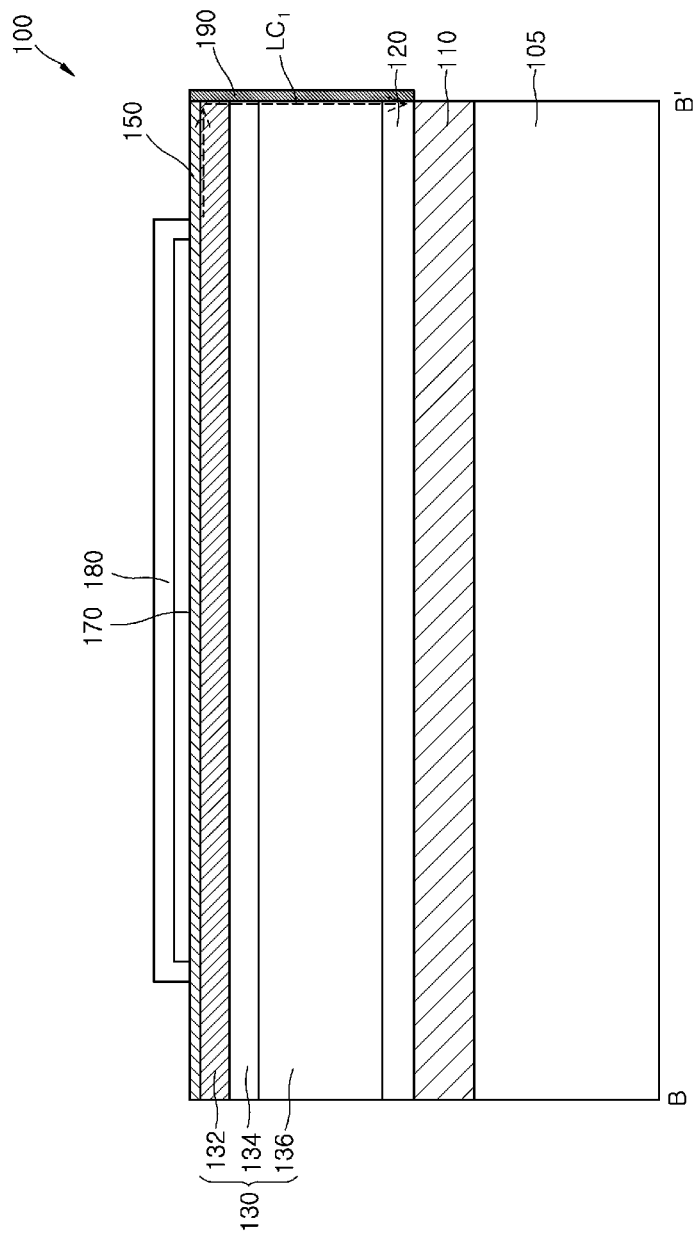
FIG. 1C is a cross-sectional view taken along a line B-B' of FIG. 1A.

Referring to FIGS. 1A, 1B, and 1C, the nitride-based transistor 100 may include a drain electrode 110 disposed on a substrate 105, a lower nitride-based semiconductor layer 120 disposed on the drain electrode 110 and heavily doped with impurities of a first conductivity type, and a semiconductor structure 130 disposed on the lower nitride-based semiconductor layer 120. The semiconductor structure 130 may include a first nitride-based semiconductor layer 132 doped with impurities of the first conductivity type, a second nitride-based semiconductor layer 134 doped with impurities of a second conductivity type and disposed between the first nitride-based semiconductor layer 132 and the lower nitride-based semiconductor layer 120, and a third nitride-based semiconductor layer 136 doped with impurities of the first conductivity type and disposed between the second nitride-based semiconductor layer 134 and the lower nitride-based semiconductor layer 120.

A gate electrode 140 may be disposed in a trench penetrating the first and second nitride-based semiconductor layers 132 and 134 and extending into the third nitride-based semiconductor layers 136. A gate dielectric layer 150 may be disposed between the gate electrode 140 and an inner surface of the trench. If a gate voltage over a threshold voltage is applied to the gate electrode 140, a vertical channel layer 142 may be formed at a sidewall of the second nitride-based semiconductor layer 134 contacting the gate dielectric layer 150.

A source electrode 170 may be disposed on the first nitride-based semiconductor layer 132 and may be spaced apart from the gate electrode 140. An insulation pattern 180 may cover the source electrode 170 to electrically insulate the source electrode 170 from the gate electrode 140.

The nitride-based transistor 100 may further include a passivation layer 190 disposed on outer sidewalls of the lower nitride-based semiconductor layer 120 and the semiconductor structure 130 to suppress leakage current LC1 (see arrows in FIGS. 1B and 1C) flowing from the source electrode 170 toward the drain electrode 110 along the outer sidewalls of the lower nitride-based semiconductor layer 120 and the semiconductor structure 130. The leakage current LC1 may flow due to defect sites located at an interface between the first nitride-based semiconductor layer 132 and the gate dielectric layer 150, as well as due to defect sites located at an interface between the semiconductor structure 130 and the passivation layer 190. When the leakage current LC1 increases, a high voltage characteristic of the nitride-based transistor 100 may be degraded. The passivation layer 190 may be formed to reduce a density of the defect sites located at outer sidewall surfaces of the semiconductor structure 130. Accordingly, the leakage current LC1 may be reduced due to the presence of the passivation layer 190.

Figure 2B:
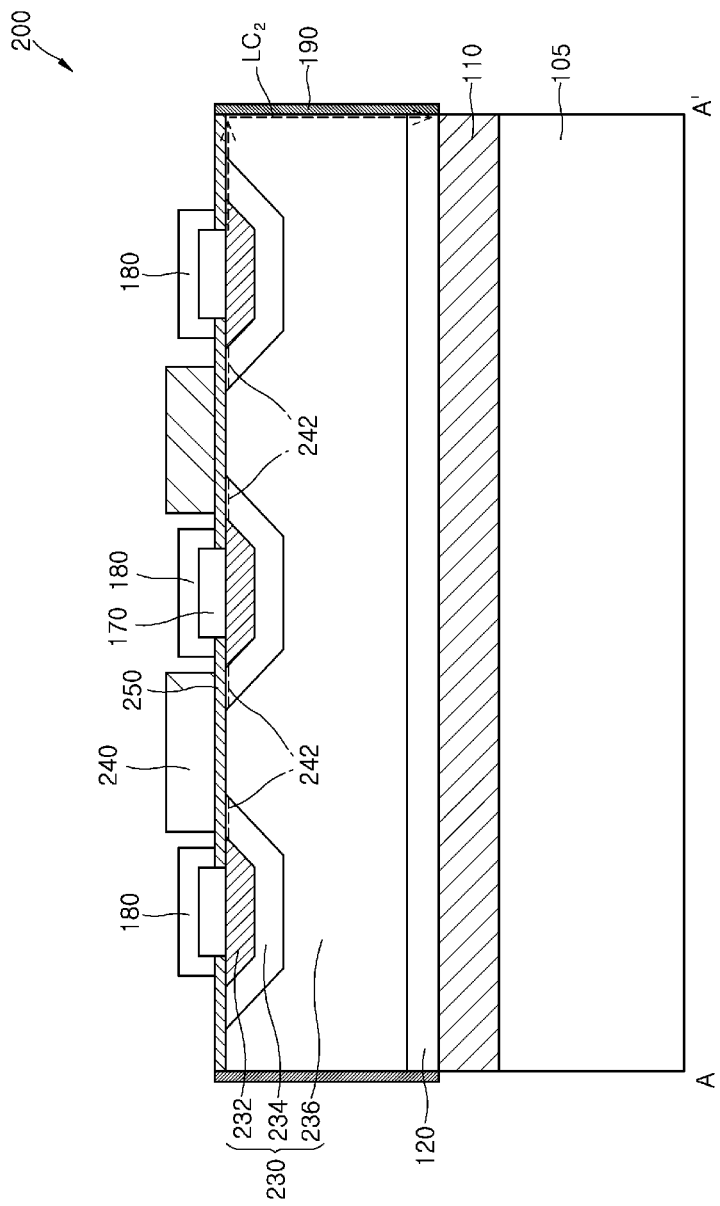
FIG. 2B is a cross-sectional view taken along a line A-A' of FIG. 2A.

FIG. 2A is a plan view illustrating a nitride-based transistor 200 according to an exemplary embodiment of the present invention. FIG. 2B is a cross-sectional view taken along a line A-A' of FIG. 2A, and FIG. 2C is a cross-sectional view taken along a line B-B' of FIG. 2A.

Referring to FIGS. 2A, 2B, and 2C, a first nitride-based semiconductor layer 232 doped with impurities of a first conductivity type may be disposed under the source electrode 170. A second nitride-based semiconductor layer 234 doped with impurities of a second conductivity type may be disposed to surround sidewalls and a bottom surface of the first nitride-based semiconductor layer 232. In addition, a third nitride-based semiconductor layer 236 doped with impurities of the first conductivity type may be disposed to surround sidewalls and a bottom surface of the second nitride-based semiconductor layer 234. Top surfaces of the second and third nitride-based semiconductor layers 234 and 236 may be coplanar with a top surface of the first nitride-based semiconductor layer 232. The first, second, and third nitride-based semiconductor layers 232, 234, and 236 may constitute a semiconductor structure 230.

The lower nitride-based semiconductor layer 120 heavily doped with impurities of the first conductivity type may be disposed under the third nitride-based semiconductor layer 236, and the drain electrode 110 may be disposed under the lower nitride-based semiconductor layer 120.

A gate electrode 240 may be disposed to overlap the top surface of the second nitride-based semiconductor layer 234. A gate dielectric layer 250 may be disposed between the gate electrode 240 and the second nitride-based semiconductor layer 234. If a gate voltage over a threshold voltage is applied to the gate electrode 240, a horizontal channel layer 242 may be formed in the second nitride-based semiconductor layer 234. If a drain voltage is applied between the source electrode 170 and the drain electrode 110, electric charges (e.g., electrons) in the first nitride-based semiconductor layer 232 may laterally drift along the channel layer 242 and may vertically drift to reach the drain electrode 110.

As illustrated in FIGS. 2B and 2C, leakage current LC2 may flow between the source electrode 170 and the drain electrode 110 of the nitride-based transistor 200. As indicated by an arrow in FIG. 2B, electric charges in the first nitride-based semiconductor layer 232 may laterally drift through defect sites located at an interface between the semiconductor structure 230 and the gate dielectric layer 250 and may vertically drift through defect sites located at an interface between the semiconductor structure 230 and the passivation layer 190. That is, the leakage current LC2 may flow between the source electrode 170 and the drain electrode 110 along a parasitic path excluding the horizontal channel layer 242. Similarly, as indicated by an arrow in FIG. 2C, electric charges in the source electrode 170 (i.e., the first nitride-based semiconductor layer 232) may laterally drift through defect sites located at an interface between the first nitride-based semiconductor layer 232 and the gate dielectric layer 250 and may vertically drift through defect sites located at an interface between the semiconductor structure 230 and the passivation layer 190. That is, the leakage current LC2 may also flow between the source electrode 170 and the drain electrode 110 along another parasitic path excluding the horizontal channel layer 242. When the leakage current LC2 increases, a high voltage characteristic of the nitride-based transistor 200 may be degraded. The passivation layer 190 may be formed to reduce a density of the defect sites located at outer sidewall surfaces of the semiconductor structure 230. Accordingly, the leakage current LC2 may be reduced due to the presence of the passivation layer 190.

Figure 3A:
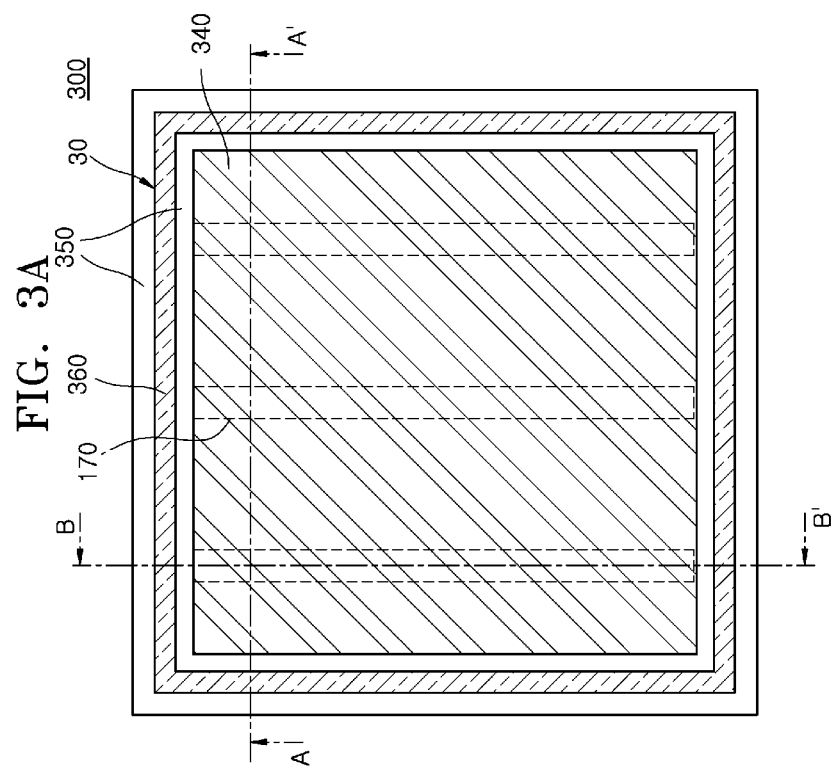
FIG. 3A is a plan view illustrating a nitride-based transistor according to an exemplary embodiment of the present invention.
Figure 3B:
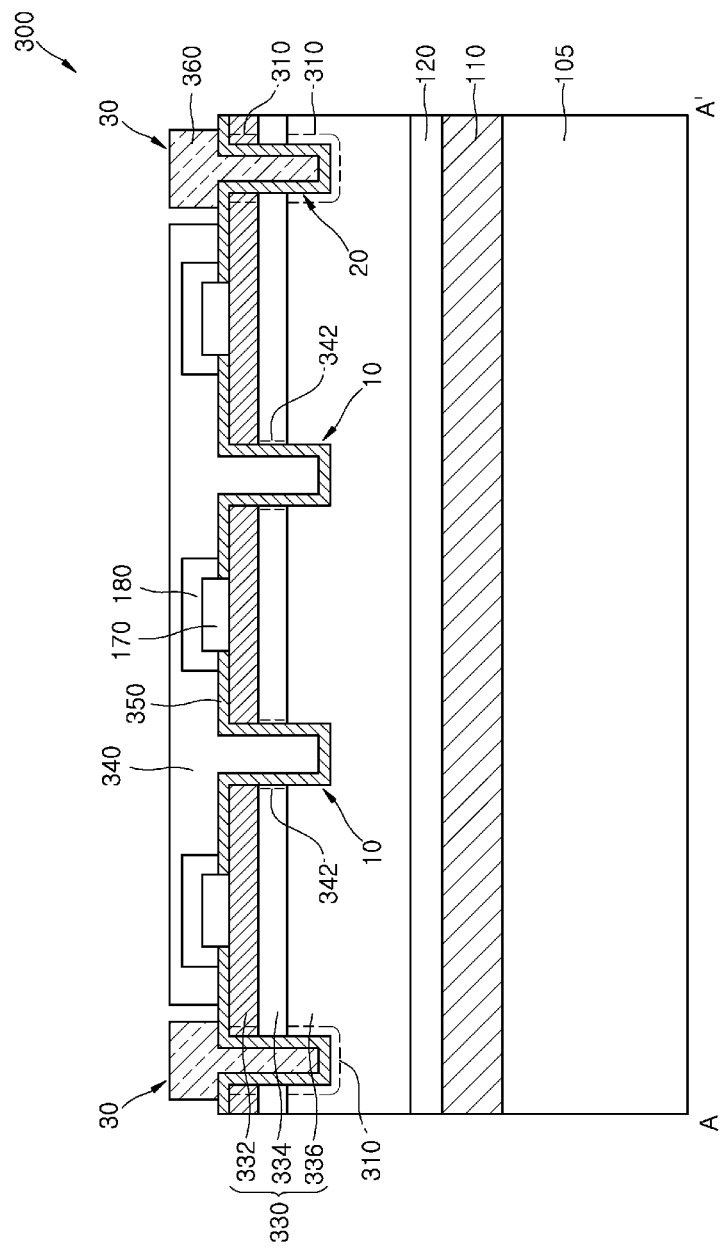
FIG. 3B is a cross-sectional view taken along a line A-A' of FIG. 3A.
Figure 3C:
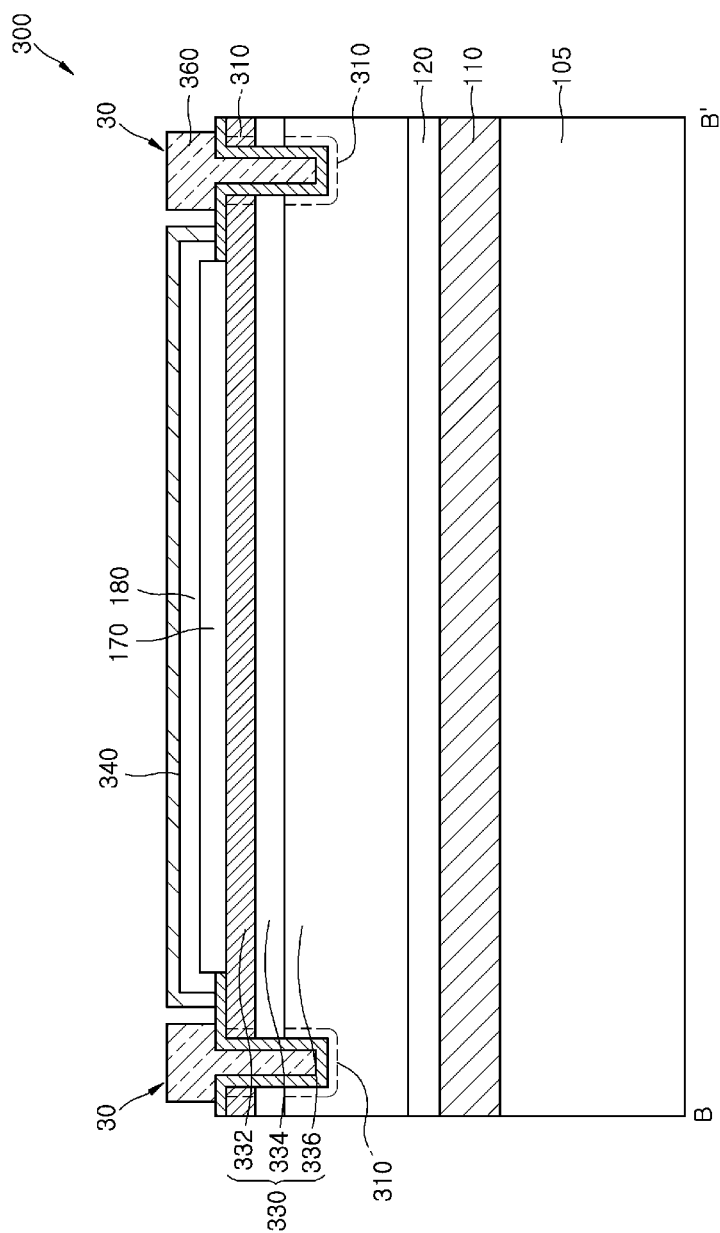
FIG. 3C is a cross-sectional view taken along a line B-B' of FIG. 3A.

FIG. 3A is a plan view illustrating a nitride-based transistor 300 according to an exemplary embodiment of the present invention. FIG. 3B is a cross-sectional view taken along a line A-A' of FIG. 3A, and FIG. 3C is a cross-sectional view taken along a line B-B' of FIG. 3A. Referring to FIGS. 3A, 3B, and 3C, the nitride-based transistor 300 may include a semiconductor structure 330. The semiconductor structure 330 may include a first nitride-based semiconductor layer 332 doped with impurities of a first conductivity type, a second nitride-based semiconductor layer 334 doped with impurities of a second conductivity type, and a third nitride-based semiconductor layer 336 doped with impurities of the first conductivity type, which are disposed adjacent to each other. For example, the third nitride-based semiconductor layer 336, the second nitride-based semiconductor layer 334, and the first nitride-based semiconductor layer 332 may be sequentially stacked on the lower nitride-based semiconductor layer 120. The drain electrode 110 may be disposed between the lower nitride-based semiconductor layer 120 and the substrate 105.

The source electrode 170 may be disposed on the first nitride-based semiconductor layer 332 and may be electrically connected to the first nitride-based semiconductor layer 332. The insulation pattern 180 may cover the source electrode 170 to electrically insulate the source electrode 170 from a gate electrode 340. The drain electrode 110 may be electrically connected to the third nitride-based semiconductor layer 336 through the lower nitride-based semiconductor layer 120.

The gate electrode 340 may be disposed in a first trench 10 penetrating the first and second nitride-based semiconductor layers 332 and 334 and extending into the third nitride-based semiconductor layers 336. A gate dielectric layer 350 may be disposed between the gate electrode 340 and an inner surface of the first trench 10. If a gate voltage over a threshold voltage is applied to the gate electrode 340, a channel layer 342 may be formed at a sidewall of the second nitride-based semiconductor layer 334 contacting the gate dielectric layer 350. The channel layer 342 may be vertically induced in the second nitride-based semiconductor layer 334.

Referring again to FIG. 3A, a leakage current suppression structure 30 for generating a charge depletion layer 310 in the first nitride-based semiconductor layer 332 or the third nitride-based semiconductor layer 336 may be disposed along edges of the semiconductor structure 330. As illustrated in FIGS. 3B and 3C, the leakage current suppression structure 30 may include a second trench 20 penetrating the first and second nitride-based semiconductor layers 332 and 334 and extending into the third nitride-based semiconductor layers 336, and a conductive layer 360 disposed in the second trench 20. The gate dielectric layer 350 may be also disposed between the conductive layer 360 and an inner surface of the second trench 20. The conductive layer 360 may include a conductive material having a work function that is capable of generating the depletion layer 310 in at least one of the first and third nitride-based semiconductor layers 332 and 336. That is, the depletion layer 310 may be formed by work function difference between the conductive layer 360 and at least one of the first and third nitride-based semiconductor layers 332 and 336.

In an exemplary embodiment of the present invention, if the first and third nitride-based semiconductor layers 332 and 336 are doped with N-type impurities and the second nitride-based semiconductor layer 334 is doped with P-type impurities, an electron depletion layer 310 may be formed in the first and third nitride-based semiconductor layers 332 and 336 due to the presence of the conductive layer 360. The electron depletion layer 310 may trap the electrons that drift through defect sites located at an interface between the semiconductor structure 330 and a heterogeneous layer (e.g., the gate dielectric layer 350), and the trapped electrons may be recombined with holes to reduce leakage current.

In another exemplary embodiment of the present invention, if the first and third nitride-based semiconductor layers 332 and 336 are doped with P-type impurities and the second nitride-based semiconductor layer 334 is doped with N-type impurities, a hole depletion layer 310 may be formed in the first and third nitride-based semiconductor layers 332 and 336 due to the presence of the conductive layer 360. The hole depletion layer 310 may trap the holes that drift through defect sites located at an interface between the semiconductor structure 330 and a heterogeneous layer (e.g., the gate dielectric layer 350), and the trapped holes may be recombined with electrons to reduce leakage current.

Although not shown in the drawings, in an exemplary embodiment of the present invention, the second trench 20 may be disposed such that a bottom surface of the second trench 20 is located at a level between a top surface and a bottom surface of the second nitride-based semiconductor layer 334. A distance between the third nitride-based semiconductor layer 336 and a bottom surface of the second trench 20 may be equal to or less than a vertical thickness of a depletion layer generated in the second nitride-based semiconductor layer 334 when the second and third nitride-based semiconductor layers 334 and 336 contact each other to form a P-N junction therebetween. Alternatively, the second trench 20 may penetrate the first and second nitride-based semiconductor layers 332 and 334 to expose a top surface of the third nitride-based semiconductor layer 336. That is, the bottom surface of the second trench 20 may be coplanar with the top surface of the third nitride-based semiconductor layer 336.

As illustrated in FIG. 3A, the second trench 20 and the conductive layer 360 of the leakage current suppression structure 30 may be disposed along edges of the semiconductor structure 330. Thus, the leakage current suppression structure 30 may effectively suppress the leakage current that flows along outer sidewalls of the semiconductor structure 330.

An electric potential of the conductive layer 360 of the leakage current suppression structure 30 may be independently controlled regardless of an electric potential of the gate electrode 340. That is, when the nitride-based transistor 300 operates, the electric potential of the conductive layer 360 may be controlled to have a constant value regardless of a gate voltage applied to the gate electrode 340. In an exemplary embodiment of the present invention, the conductive layer 360 may be floated.

Figure 4B:
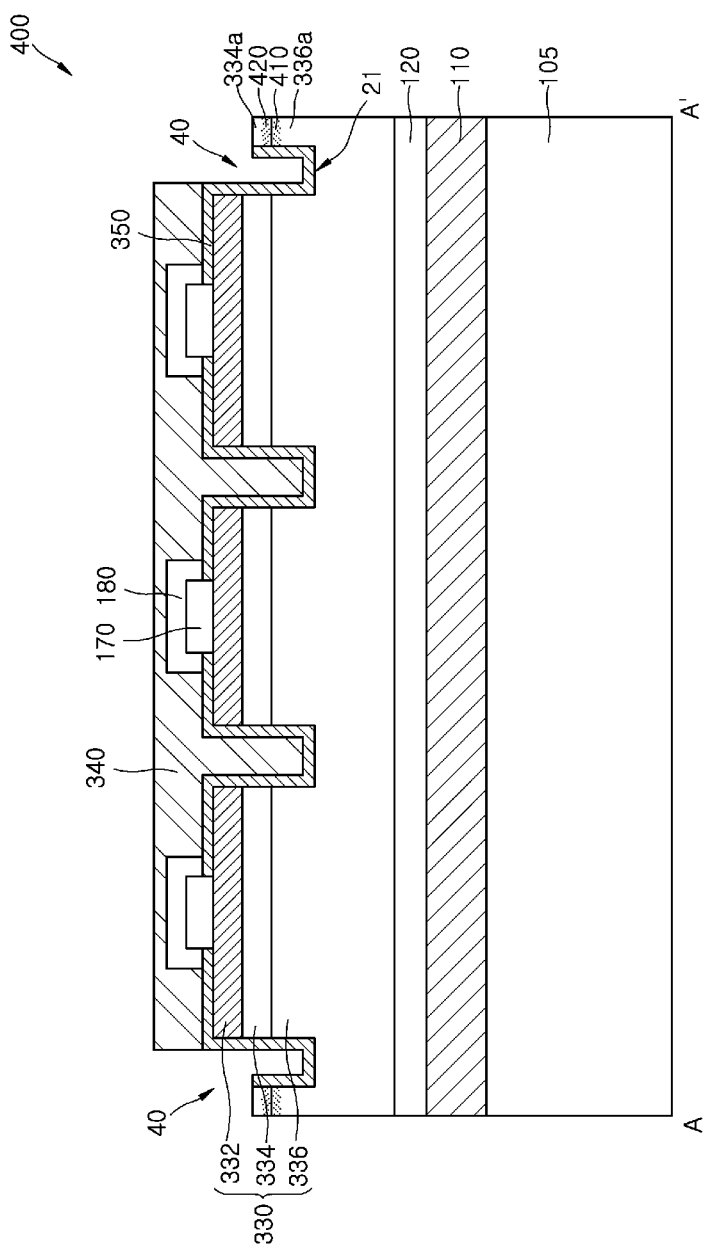
FIG. 4B is a cross-sectional view taken along a line A-A' of FIG. 4A.

FIG. 4A is a plan view illustrating a nitride-based transistor 400 according to an exemplary embodiment of the present invention. FIG. 4B is a cross-sectional view taken along a line A-A' of FIG. 4A, and FIG. 4C is a cross-sectional view taken along a line B-B' of FIG. 4A.

Figure 4C:
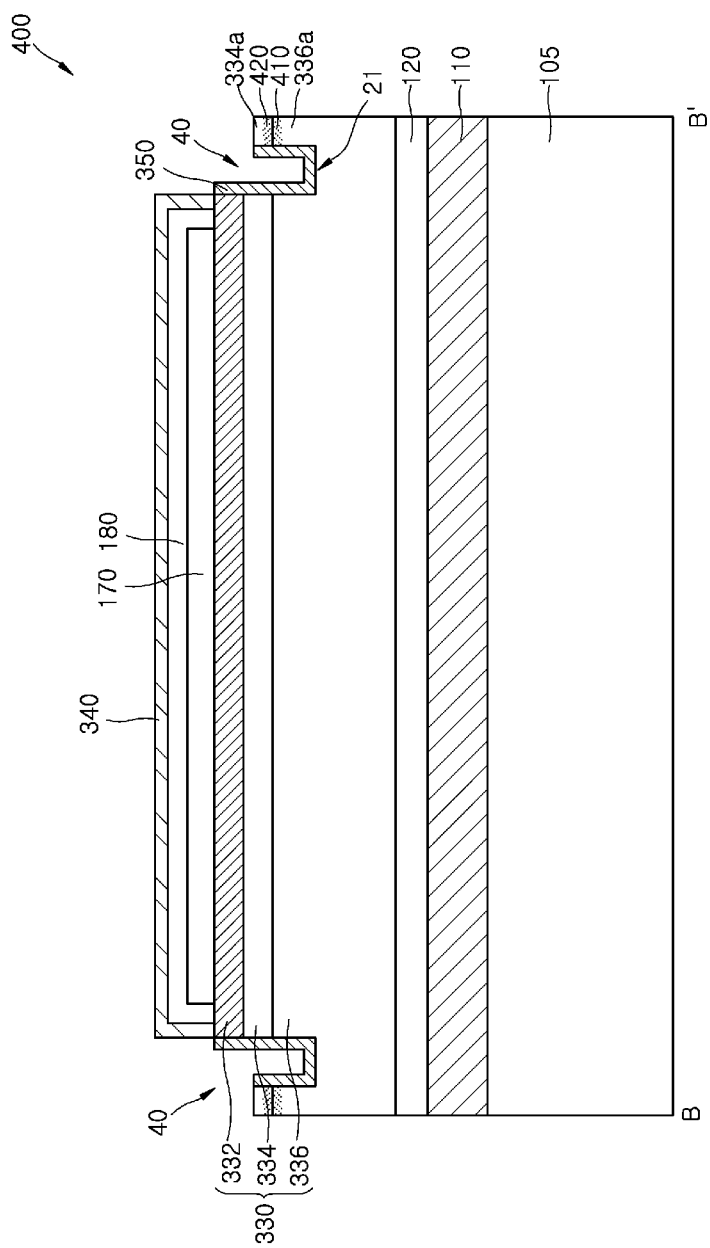
FIG. 4C is a cross-sectional view taken along a line B-B' of FIG. 4A.

Referring to FIGS. 4A, 4B, and 4C, the nitride-based transistor 400 may have substantially the same configuration as the nitride-based transistor 300 described with reference to FIGS. 3A, 3B, and 3C except a structure of a leakage current suppression structure 40. Thus, differences between the present embodiment and the previous embodiment illustrated in FIGS. 3A, 3B and 3C will be mainly described hereinafter to avoid duplicate explanation.

The leakage current suppression structure 40 may include a second trench 21 extending from a top surface of the first nitride-based semiconductor layer 332 into a bulk region of the third nitride-based semiconductor layer 336, and a stack structure including a second nitride-based semiconductor pattern 334a and a third nitride-based semiconductor pattern 336a which are disposed to be adjacent to an outer sidewall of the second trench 21. The second trench 21 may be disposed along edges of the semiconductor structure 330. The second nitride-based semiconductor pattern 334a may be separated from the second nitride-based semiconductor layer 334 by the second trench 21. Thus, the second nitride-based semiconductor pattern 334a may be electrically floated or may be controlled to have an electric potential which is different from an electric potential of the second nitride-based semiconductor layer 334.

Since a P-N junction is provided by the second and third nitride-based semiconductor patterns 334a and 336a, charge depletion layers 410 and 420 may be generated in the second and third nitride-based semiconductor patterns 334a and 336a. The depletion layers 410 and 420 may be disposed to be adjacent to an interface between the second and third nitride-based semiconductor patterns 334a and 336a. The charge depletion layers 410 and 420, that is, an electron depletion layer and a hole depletion layer may trap charges that drift through defect sites located at an interface between the semiconductor structure 330 and a heterogeneous layer (e.g., the gate dielectric layer 350), and the trapped charges may be recombined with holes or electrons. That is, if the leakage current suppression structure 40 is employed in the nitride-based transistors 100 and 200 shown in FIGS. 1A-1C and 2A-2C, the leakage current components LC1 and LC2 of the nitride-based transistors 100 and 200 may be significantly reduced.

Although not shown in the drawings, in an exemplary embodiment of the present invention, the second trench 21 may be disposed such that a bottom surface of the second trench 21 is located at a level between a top surface and a bottom surface of the second nitride-based semiconductor layer 334. A distance between the third nitride-based semiconductor layer 336 and a bottom surface of the second trench 21 may be equal to or less than a vertical thickness of a depletion layer generated in the second nitride-based semiconductor layer 334 when the second and third nitride-based semiconductor layers 334 and 336 contact each other to form a P-N junction therebetween. Alternatively, the second trench 21 may penetrate the first and second nitride-based semiconductor layers 332 and 334 to expose a top surface of the third nitride-based semiconductor layer 336. That is, the bottom surface of the second trench 21 may be coplanar with the top surface of the third nitride-based semiconductor layer 336.

Figure 5A:
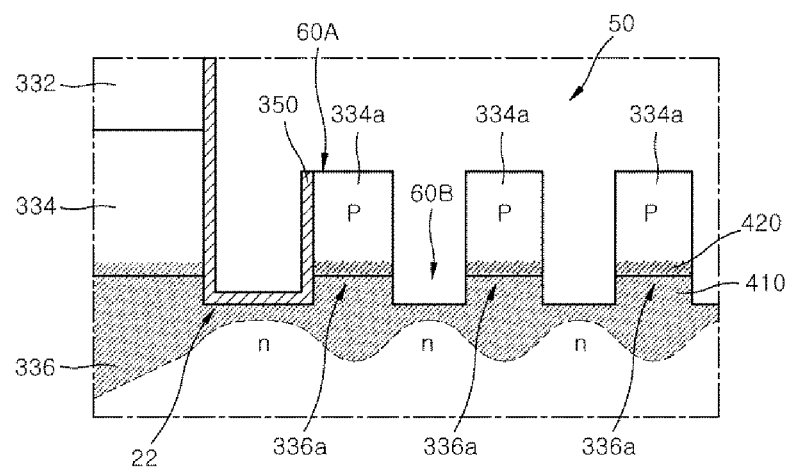
FIGS. 5A and 5B are cross-sectional views illustrating leakage current suppression structures employed in nitride-based transistors according to exemplary embodiments of the present invention.
Figure 5B:
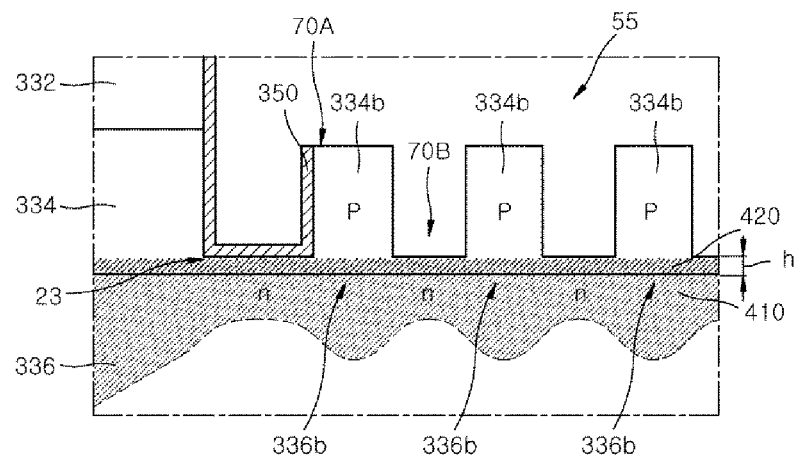

FIGS. 5A and 5B are cross-sectional views illustrating leakage current suppression structures 50 and 55 employed in nitride-based transistors according to an exemplary embodiment of the present invention. The leakage current suppression structure 50 or 55 may be employed in the nitride-based transistor 400 illustrated in FIGS. 4A-4C.

Referring to FIG. 5A, the illustrating leakage current suppression structure 50 may include a second trench 22 that is disposed to extend from a top surface of the first nitride-based semiconductor layer 332 into a bulk region of the third nitride-based semiconductor layer 336 and stack structures that are laterally arrayed at one side of the second trench 22. Each of the stack structures may include the third nitride-based semiconductor pattern 336a and the second nitride-based semiconductor pattern 334a, which are vertically stacked.

As illustrated in FIG. 5A, the illustrating leakage current suppression structure 50 may include protrusions 60A and a plurality of grooves 60B, which are defined by the stack structures. That is, the protrusions 60A and the grooves 60B may be alternately arrayed in a horizontal direction. A thickness of the depletion layer 410 generated in the third nitride-based semiconductor pattern 336a of each protrusion 60A may be greater than a thickness of the depletion layer 410 generated in the third nitride-based semiconductor layer 336 under each groove 60B.

In the leakage current suppression structure 50 described above, defect sites located at an interface between the semiconductor structure 332, 334, and 336 (or the protrusions 60A) and a heterogeneous layer (e.g., the gate dielectric layer 350), or defect sites located at an interface between the semiconductor structure 332, 334, and 336 (or the protrusions 60A) and air, may constitute a leakage current path. However, a length of the leakage current path may increase because of the presence of the protrusions 60A and the grooves 60B, and charges drifted along the leakage current path may be trapped in the depletion layers 410 or 420 disposed on the leakage current path and may be recombined with electrons or holes. As a result, leakage current may be significantly reduced by the leakage current suppression structure 50 including the protrusions 60A and the grooves 60B.

Referring to FIG. 5B, the leakage current suppression structure 55 may include protrusions 70A laterally arrayed and grooves 70B disposed between the plurality of protrusions 70A. Each of the protrusions 70A may include a second nitride-based semiconductor pattern 334b and a third nitride-based semiconductor pattern 336b, which are stacked. The protrusions 70A may be defined by forming a second trench 23 that extends from a top surface of the first nitride-based semiconductor layer 332 into a bulk region of the second nitride-based semiconductor layer 334. A distance H between the third nitride-based semiconductor layer 336 and a bottom surface of the second trench 23 may be equal to or less than a vertical thickness of the depletion layer 420 generated in the second nitride-based semiconductor pattern 334b when the second and third nitride-based semiconductor patterns 334b and 336b contact each other to form a P-N junction therebetween.

In FIGS. 5A and 5B, the second nitride-based semiconductor patterns 334a and 334b may be floated or may be controlled to have an electric potential which is different from an electric potential of the second nitride-based semiconductor layer 334.

Figure 6A:
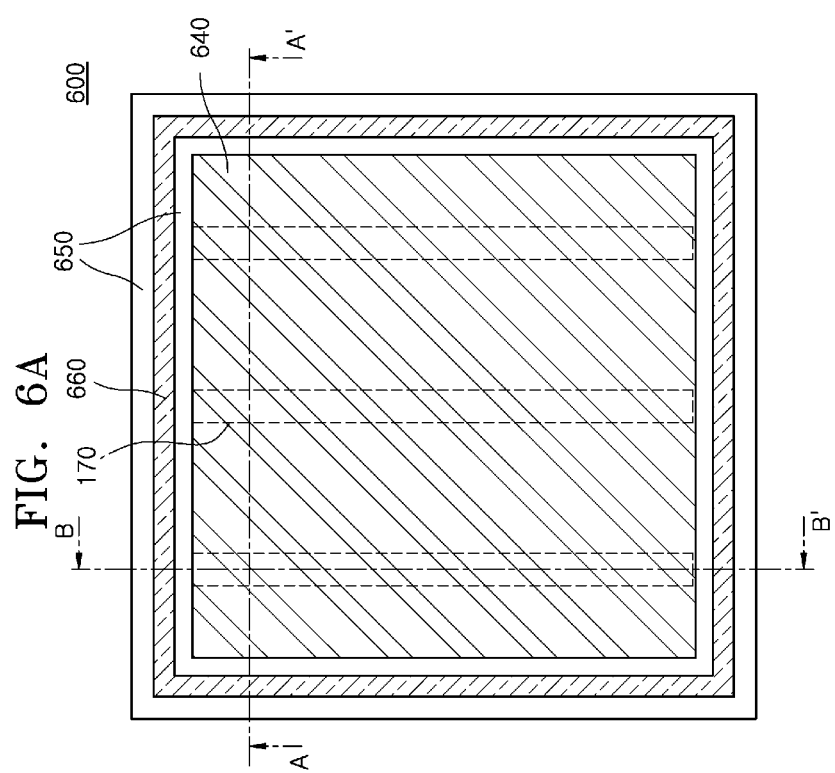
FIG. 6A is a plan view illustrating a nitride-based transistor according to an exemplary embodiment of the present invention.
Figure 6B:
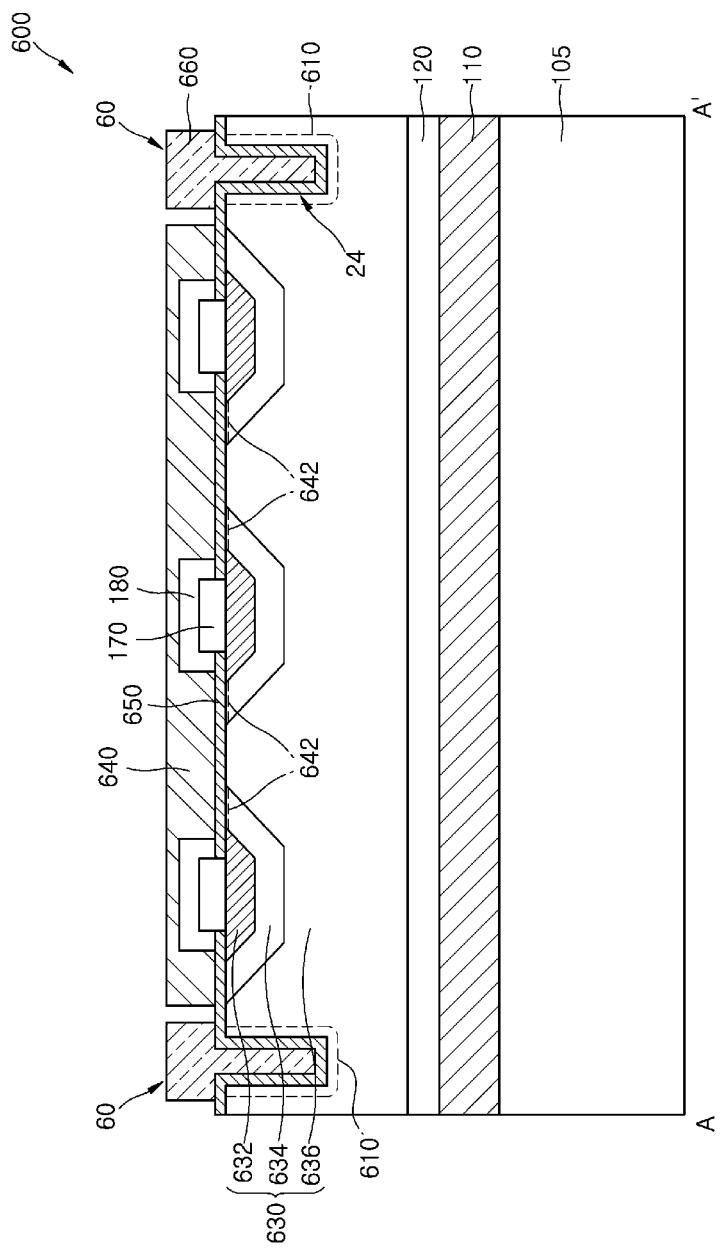
FIG. 6B is a cross-sectional view taken along a line A-A' of FIG. 6A.

FIG. 6A is a plan view illustrating a nitride-based transistor 600 according to an exemplary embodiment of the present invention. FIG. 6B is a cross-sectional view taken along a line A-A' of FIG. 6A, and FIG. 6C is a cross-sectional view taken along a line B-B' of FIG. 6A.

Figure 6C:
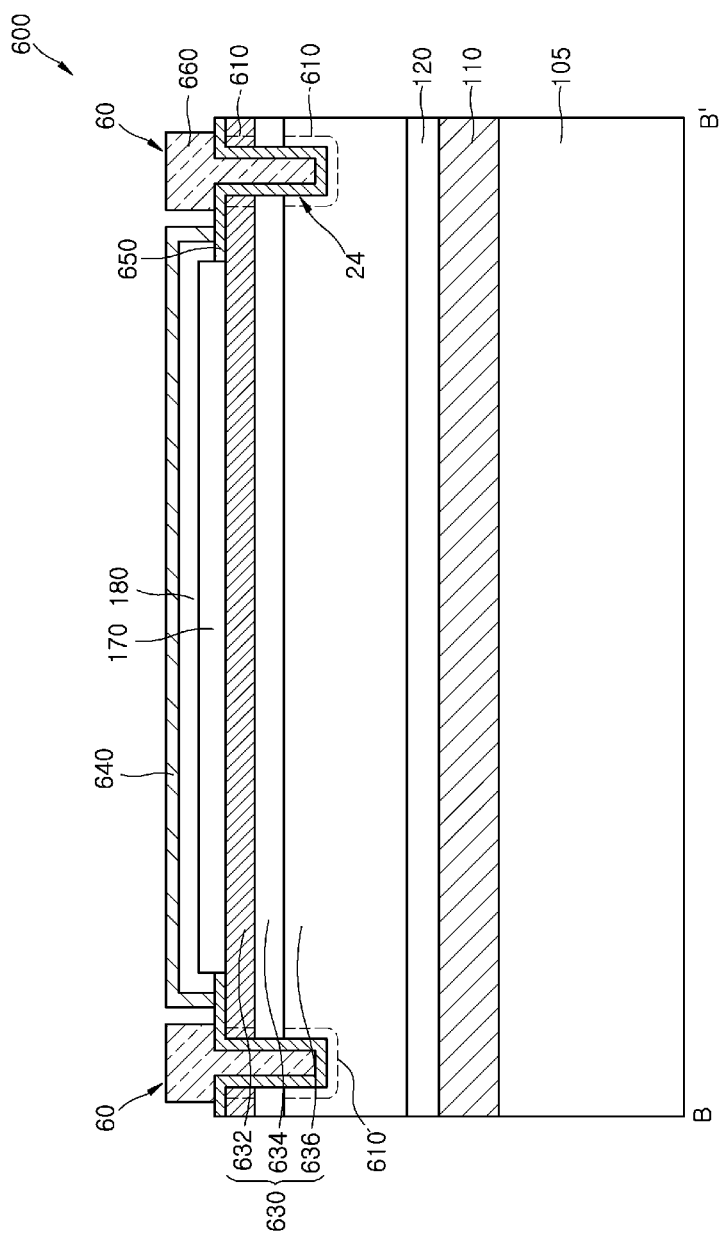
FIG. 6C is a cross-sectional view taken along a line B-B' of FIG. 6A.

Referring to FIGS. 6A, 6B, and 6C, the nitride-based transistor 600 may include a first nitride-based semiconductor layer 632 disposed under the source electrode 170, a second nitride-based semiconductor layer 634 disposed to surround sidewalls and a bottom surface of the first nitride-based semiconductor layer 632, and a third nitride-based semiconductor layer 636 disposed to surround sidewalls and a bottom surface of the second nitride-based semiconductor layer 634. Top surfaces of the second and third nitride-based semiconductor layers 634 and 636 may be coplanar with a top surface of the first nitride-based semiconductor layer 632. The first, second and third nitride-based semiconductor layers 632, 634 and 636 may constitute a semiconductor structure 630. A gate electrode 640 may be disposed to overlap with the top surface of the second nitride-based semiconductor layer 634. A horizontal channel layer 642 may be formed in the second nitride-based semiconductor layer 634. A gate dielectric layer 650 may be disposed between the gate electrode 640 and the second nitride-based semiconductor layer 634.

A leakage current suppression structure 60 may include a trench 24 penetrating the third nitride-based semiconductor layer 636, and a conductive layer 660 disposed in the trench 24. An insulation layer such as a gate dielectric layer 650 may be disposed between the conductive layer 660 and an inner surface of the trench 24. The conductive layer 660 may include a conductive material having a work function that is capable of generating the depletion layer 610 in at least one of the first and third nitride-based semiconductor layers 632 and 636. That is, the depletion layer 610 may be formed by work function difference between the conductive layer 660 and at least one of the first and third nitride-based semiconductor layers 632 and 636.

As described above, the depletion layer 610 may be formed in the third nitride-based semiconductor layer 636 due to the presence of the conductive layer 660 (see FIG. 6B). In addition, the depletion layer 610 may be formed in the first and third nitride-based semiconductor layers 632 and 636 due to the presence of the conductive layer 660 (see FIG. 6C). The conductive layer 660 may be electrically insulated from the gate electrode 640. Moreover, the conductive layer 660 may be electrically floated or may be controlled to have an electric potential which is different from an electric potential of the gate electrode 640.

The depletion layer 610 may suppress charges that drift through defect sites located at an interface between the semiconductor structure 630 and a heterogeneous layer (i.e., the gate dielectric layer 650). Thus, leakage current flowing from the drain electrode 110 toward the source electrode 170 through parasitic current paths other than the channel layer 642 may be effectively reduced because of the presence of the depletion layer 610.

Furthermore, as illustrated in FIG. 6A, the trench 24 and the conductive layer 660 of the leakage current suppression structure 60 may be disposed to surround edges of the semiconductor structure 630. Thus, the leakage current suppression structure 60 including the trench 24 and the conductive layer 660 may effectively suppress the leakage current that flows along outer sidewall surfaces of the semiconductor structure 630.

Figure 7B:
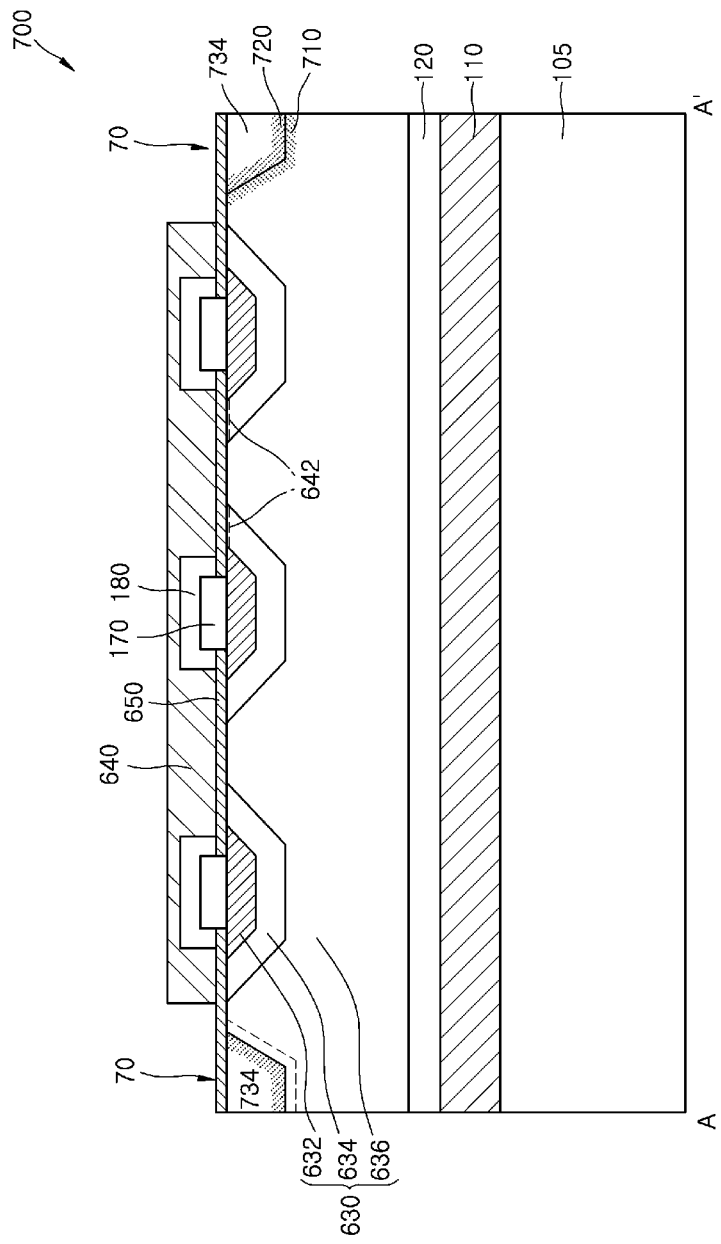
FIG. 7B is a cross-sectional view taken along a line A-A' of FIG. 7A.

FIG. 7A is a plan view illustrating a nitride-based transistor 700 according to an exemplary embodiment of the present invention. FIG. 7B is a cross-sectional view taken along a line A-A' of FIG. 7A, and FIG. 7C is a cross-sectional view taken along a line B-B' of FIG. 7A. Referring to FIGS. 7A, 7B, and 7C, the nitride-based transistor 700 may have substantially the same configuration as the nitride-based transistor 600 described above with reference to FIGS. 6A, 6B, and 6C, except a structure of a leakage current suppression structure 70.

Referring to FIGS. 7A and 7B, the leakage current suppression structure 70 may include a pair of semiconductor layers 734 that are disposed in two opposite edges of the semiconductor structure 630 and is doped with impurities of a second conductivity type. The semiconductor layers 734 may be arrayed in a horizontal direction that the source electrodes 170 are arrayed. That is, the source electrodes 170 may be disposed between the pair of semiconductor layers 734 and may be parallel with the pair of semiconductor layers 734. The semiconductor layers 734 may contact the third nitride-based semiconductor layer 636 to provide a P-N junction structure, and depletion layers 710 and 720 may be respectively formed in the third nitride-based semiconductor layer 636 and the semiconductor layers 734. The depletion layers 710 and 720 may trap charges that drift through defect sites located at an interface between the semiconductor structure 630 and a heterogeneous layer (e.g., the gate dielectric layer 350), and the trapped charges may be recombined with holes or electrons to reduce leakage current. The semiconductor layers 734 may be electrically floated or may be controlled to have an electric potential which is different from an electric potential of the second nitride-based semiconductor layer 634.

Referring to FIGS. 7A and 7C, the leakage current suppression structure 70 may further include a pair of trenches 25 that are disposed in two opposite edges of the semiconductor structure 630 along a horizontal direction intersecting the source electrodes 170 and a pair of stack patterns that are disposed to be adjacent to outer sidewalls of the trenches 25. Each of the stack patterns may include a third nitride-based semiconductor pattern 636a and a second nitride-based semiconductor pattern 634a, which are sequentially stacked. The second nitride-based semiconductor patterns 634a may be electrically floated or may be controlled to have an electric potential which is different from an electric potential of the second nitride-based semiconductor layer 634 disposed between the pair of trenches 25.

The second and third nitride-based semiconductor patterns 634a and 636a constituting the leakage current suppression structure 70 may contact each other to provide P-N junction structures, and the depletion layers 710 and 720 may also be generated in the second and third nitride-based semiconductor patterns 634a and 636a. The depletion layers 710 and 720, that is, an electron depletion layer and a hole depletion layer may trap charges that drift through defect sites located at an interface between the semiconductor structure 630 and a heterogeneous layer (e.g., a gate dielectric layer 650), and the trapped charges may be recombined with holes or electrons to reduce leakage current.

In an exemplary embodiment of the present invention, the stack patterns may be disposed to be adjacent to outer sidewalls of the trenches 25. The trench 25 and the stack patterns included in the leakage current suppression structure 70 may have substantially the same configuration as any one of the leakage current suppression structures 50 and 55 illustrated in FIGS. 5A and 5B.

In an exemplary embodiment of the present invention, the trench 25 may be disposed such that a bottom surface of the trench 25 is located at a level between a top surface and a bottom surface of the second nitride-based semiconductor layer 634. A distance between the third nitride-based semiconductor layer 636 and a bottom surface of the trench 25 may be equal to or less than a vertical thickness of a depletion layer generated in the second nitride-based semiconductor layer 634 when the second and third nitride-based semiconductor layers 634 and 636 contact each other to form a P-N junction therebetween. Alternatively, the trench 25 may penetrate the first and second nitride-based semiconductor layers 632 and 634 to expose a top surface of the third nitride-based semiconductor layer 636. That is, the bottom surface of the trench 25 may be coplanar with the top surface of the third nitride-based semiconductor layer 636.

The leakage current suppression structure 70 of the nitride-based transistor 700 according to the present exemplary embodiment may include the semiconductor layers 734 that are doped with impurities of a second conductivity type and are shown in a cross-sectional view taken along a line intersecting the source electrodes 170 (see FIG. 7B). In addition, the leakage current suppression structure 70 of the nitride-based transistor 700 according to the present exemplary embodiment may further include the trenches 25 and the stack patterns having the second and third nitride-based semiconductor patterns 634a and 636a that are shown in a cross-sectional view taken along a line parallel with the source electrodes 170 (see FIG. 7C). Alternatively, the leakage current suppression structure 70 may be configured to include only the semiconductor layers 734 shown in FIG. 7B. The semiconductor layers 734 may extend to surround all of edges of the semiconductor structure 630. Alternatively, the leakage current suppression structure 70 may be configured to include only the trenches 25 and the stack patterns 634a and 636a shown in FIG. 7C. The trenches 25 and the stack patterns 634a and 636a may extend to surround all of edges of the semiconductor structure 630. In an exemplary embodiment of the present invention, the leakage current suppression structure 70 may be disposed to have the cross-sectional structure shown in FIG. 7C in a direction intersecting the source electrodes 170 and to have the cross-sectional structure shown in FIG. 7B in a direction which is parallel with the source electrodes 170.

According to the exemplary embodiments of the present invention as set forth above, a leakage current suppression structure may be disposed in edges of a nitride-based transistor and may have a certain electric potential to effectively reduce leakage current that flows through an interface between a nitride-based semiconductor structure and a heterogeneous layer contacting the nitride-based semiconductor structure.

In addition, according to the exemplary embodiments of the present invention as set forth above, an electron depletion layer may be generated at the interface between the nitride-based semiconductor structure and the heterogeneous layer. Thus, the electron depletion layer may trap electrons drifted along the interface between the nitride-based semiconductor structure and the heterogeneous layer, thereby suppressing generation of the leakage current that flows through the interface between the nitride-based semiconductor structure and the heterogeneous layer.

As a result, the leakage current flowing through a parasitic path may be effectively reduced to improve a high voltage characteristic of the nitride-based transistor.

The exemplary embodiments of the present invention have been disclosed above for illustrative purposes. Those skilled in the art will appreciate that various modifications, additions and substitutions are possible, without departing from the scope and spirit of the inventive concept as disclosed in the accompanying claims.

What is claimed is:

1. A nitride-based transistor, comprising:
    a semiconductor structure comprising:
        a first nitride-based semiconductor layer doped with impurities of a first conductivity type;
        a second nitride-based semiconductor layer doped with impurities of a second conductivity type; and
        a third nitride-based semiconductor layer doped with impurities of the first conductivity type;
    a gate electrode overlapping the second nitride-based semiconductor layer;
    a leakage current suppression structure disposed along edges of the semiconductor structure; and
    a first trench penetrating the first and second nitride-based semiconductor layers and extending into the third nitride-based semiconductor layer,
    wherein:
        the first, second, and third nitride-based semiconductor layers are disposed adjacent to each other; and
        the leakage current suppression structure comprises a depletion layer disposed in at least one of the first and third nitride-based semiconductor layers.

2. The nitride-based transistor of claim 1, wherein the leakage current suppression structure further comprises a conductive layer having a work function that is capable of generating the depletion layer.

3. The nitride-based transistor of claim 1, further comprising:
    a source electrode electrically connected to the first nitride-based semiconductor layer; and
    a drain electrode electrically connected to the third nitride-based semiconductor layer.

4. The nitride-based transistor of claim 1, wherein:
    the third, second and first nitride-based semiconductor layers are sequentially stacked; and
    the gate electrode is disposed in the first trench.

5. The nitride-based transistor of claim 4, wherein when a gate voltage over a threshold voltage is applied to the gate electrode, a channel layer is vertically formed along a sidewall of the second nitride-based semiconductor layer adjacent to the gate electrode.

6. The nitride-based transistor of claim 4, wherein the leakage current suppression structure comprises:
    a second trench penetrating the first nitride-based semiconductor layer and extending into the second nitride-based semiconductor layer, or penetrating the first and second nitride-based semiconductor layers and extending into the third nitride-based semiconductor layer; and
    a conductive layer disposed in the second trench,
    wherein the conductive layer has a work function that is capable of generating the depletion layer in at least one of the first and third nitride-based semiconductor layers.

7. The nitride-based transistor of claim 6, wherein the second trench is disposed in edges of the semiconductor structure.

8. The nitride-based transistor of claim 6, further comprising an insulation layer disposed between the conductive layer and an inner surface of the second trench.

9. The nitride-based transistor of claim 4, wherein the leakage current suppression structure comprises:
    a second trench penetrating the first nitride-based semiconductor layer and extending into the second nitride-based semiconductor layer, or penetrating the first and second nitride-based semiconductor layers and extending into the third nitride-based semiconductor layer; and a stack pattern disposed adjacent to an outer sidewall of the second trench, wherein the stack pattern comprises:

a second nitride-based semiconductor pattern corresponding to a portion of the second nitride-based semiconductor layer; and a third nitride-based semiconductor pattern corresponding to a portion of the third nitride-based semiconductor layer.

10. The nitride-based transistor of claim 9, wherein:

the second trench is disposed in edges of the semiconductor structure; and the stack pattern is disposed to surround the outer sidewall of the second trench.

11. The nitride-based transistor of claim 9, wherein the stack pattern comprises sub-stack patterns arrayed in a horizontal direction and spaced apart from each other.

12. The nitride-based transistor of claim 1, wherein:

the second nitride-based semiconductor layer surrounds a bottom surface and sidewalls of the first nitride-based semiconductor layer;

the third nitride-based semiconductor layer surrounds a bottom surface and sidewalls of the second nitride-based semiconductor layer; and the gate electrode is disposed on a top surface of the second nitride-based semiconductor layer.

13. The nitride-based transistor of claim 12, wherein when a gate voltage over a threshold voltage is applied to the gate electrode, a channel layer is horizontally formed in the second nitride-based semiconductor layer along the top surface of the second nitride-based semiconductor layer.

14. The nitride-based transistor of claim 12, wherein the leakage current suppression structure comprises:

a trench extending from a top surface of the third nitride-based semiconductor layer into a bulk region of the third nitride-based semiconductor layer; and a conductive layer disposed in the trench, wherein the conductive layer has a work function that is capable of generating the depletion layer in the third nitride-based semiconductor layer.

15. The nitride-based transistor of claim 12, wherein the leakage current suppression structure comprises:

a trench extending from a top surface of the third nitride-based semiconductor layer into a bulk region of the third nitride-based semiconductor layer; and a semiconductor layer disposed in the trench and doped with impurities of the second conductivity type.

16. The nitride-based transistor of claim 12, wherein the leakage current suppression structure comprises:

a trench extending from a top surface of the third nitride-based semiconductor layer into a bulk region of the third nitride-based semiconductor layer; and a stack pattern disposed adjacent to an outer sidewall of the trench, wherein the stack pattern comprises:

a second nitride-based semiconductor pattern corresponding to a portion of the second nitride-based semiconductor layer; and a third nitride-based semiconductor pattern corresponding to a portion of the third nitride-based semiconductor layer.

17. The nitride-based transistor of claim 15, wherein the trench is disposed in edges of the semiconductor structure.

18. The nitride-based transistor of claim 16, wherein the trench is disposed in edges of the semiconductor structure.

19. A nitride-based transistor, comprising:

a semiconductor structure comprising:

a first nitride-based semiconductor layer electrically connected to a source electrode and doped with impurities of a first conductivity type;

a second nitride-based semiconductor layer contacting the first nitride-based semiconductor layer and doped with impurities of a second conductivity type; and a third nitride-based semiconductor layer electrically connected to a drain electrode and doped with impurities of the first conductivity type;

a trench disposed in edges of the semiconductor structure; and a leakage current suppression structure disposed in the trench, wherein:

the second nitride-based semiconductor layer is configured to generate a channel layer therein according to a gate voltage applied to a gate electrode; and the leakage current suppression structure comprises a depletion layer disposed in the third nitride-based semiconductor layer.

20. A nitride-based transistor, comprising:

a semiconductor structure comprising:

a first nitride-based semiconductor layer electrically connected to a source electrode and doped with impurities of a first conductivity type;

a second nitride-based semiconductor layer contacting the first nitride-based semiconductor layer and doped with impurities of a second conductivity type; and a third nitride-based semiconductor layer electrically connected to a drain electrode and doped with impurities of the first conductivity type;

a trench disposed in edges of the semiconductor structure; and a leakage current suppression structure disposed to be adjacent to an outer sidewall of the trench, wherein:

the second nitride-based semiconductor layer is configured to generate a channel layer therein according to a gate voltage applied to a gate electrode;

the leakage current suppression structure comprises a stack pattern comprising:

a second nitride-based semiconductor pattern corresponding to a portion of the second nitride-based semiconductor layer; and a third nitride-based semiconductor pattern corresponding to a portion of the third nitride-based semiconductor layer.

* * * * *